United States Patent [19]
Peterson

[11] Patent Number: 4,734,825
[45] Date of Patent: Mar. 29, 1988

[54] INTEGRATED CIRCUIT STACKABLE PACKAGE

[75] Inventor: William M. Peterson, Tempe, Ariz.

[73] Assignee: Motorola Inc., Schaumburg, Ill.

[21] Appl. No.: 904,077

[22] Filed: Sep. 5, 1986

[51] Int. Cl.[4] ............................................. H05K 1/11
[52] U.S. Cl. .................................. 361/414; 361/393; 361/394; 361/415
[58] Field of Search ............... 361/414, 415, 386, 393, 361/394

[56] References Cited
U.S. PATENT DOCUMENTS
4,551,746 11/1985 Gilbert et al. ....................... 361/414

Primary Examiner—Robert S. Macon
Attorney, Agent, or Firm—Raymond J. Warren

[57] ABSTRACT

An apparatus comprising a plurality of disks made up of interconnect devices enclosed in a housing is disclosed. The disks each have a plurality of connectors disposed about their peripheries such that the disks may be stacked and the plurality of connectors will form bus lines for the device. A connecting disk is then placed at one end of the disk stake to provide connecting leads, or pins, to the outside. These disks may then be enclosed within a housing to provide protection from the environment.

18 Claims, 10 Drawing Figures

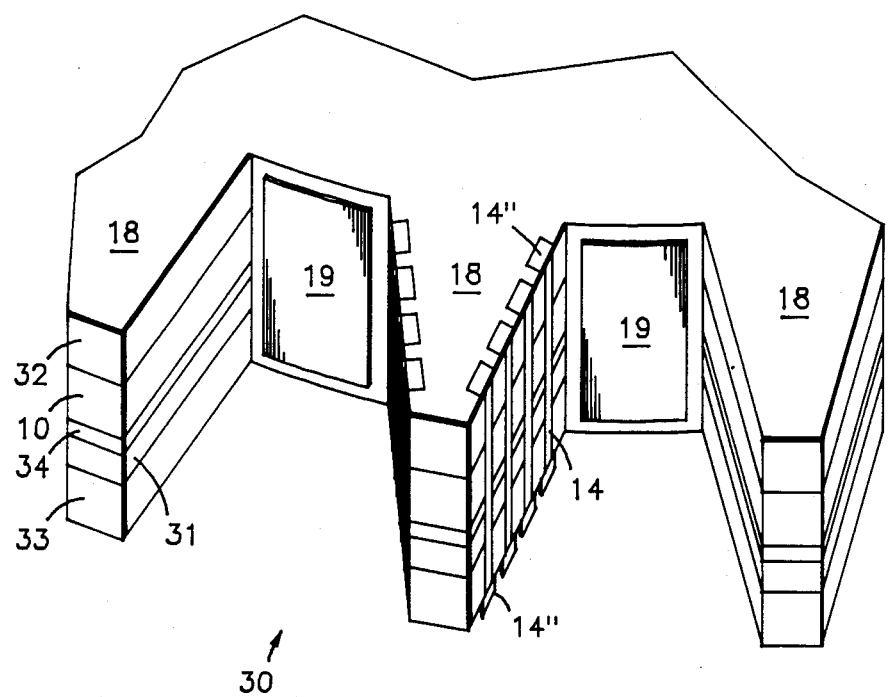
FIG. 4
FIG. 5
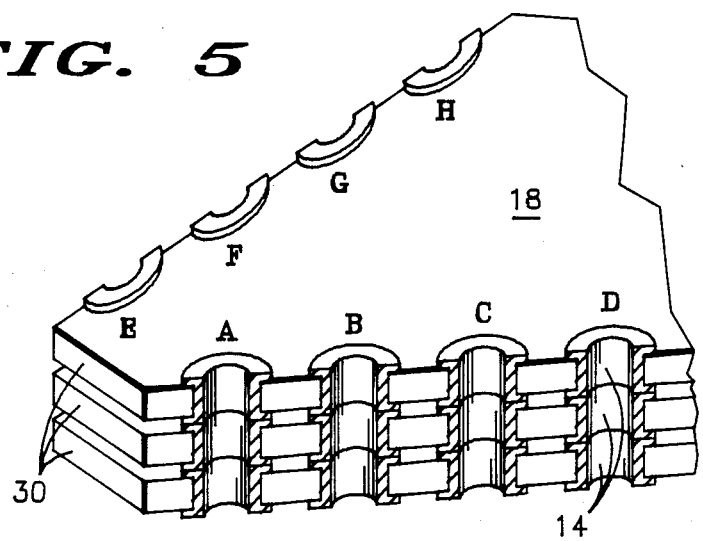

INTEGRATED CIRCUIT STACKABLE PACKAGE

BACKGROUND OF THE INVENTION

The present invention relates, in general, to stack packaging of integrated circuits and, more particularly, to stacked bus packages for integrated circuits.

Previous stack packaged IC devices are limited to the standard number of leads on the IC package. See U.S. Pat. Nos. 3,370,203, 4,116,519 and 4,437,718. This limits the number of different types of chips that may be stacked. In the prior art the type of chips to be stacked must be of the same type (e.g. all memory chips). Because of the limited number of lines, you would not be able to incorporate a microprocessor in a stack with memory chips, digital to analog convertors, or other non lead compatible devices.

SUMMARY OF THE INVENTION

Accordingly, it is an object of the present invention to provide an integrated circuit stackable package that overcomes the above deficiencies.

A further object of the present invention is to provide an integrated circuit stackable package that is capable of incorporating various types of integrated circuits.

Another object of the present invention is to provide an integrated circuit stackable package that is more economic to manufacture.

Still another object of the present invention is to provide an integrated circuit stackable package that will provide increased speed.

Yet another object of the present invention is to provide an integrated circuit stackable package that is flexible in design.

The above and other objects and advantages of the present invention are provided by an integrated circuit stackable package described herein.

A particular embodiment of the present invention consists of an integrated circuit stackable package comprising a plurality of disks each having: an integrated circuit mounted on an interconnect device, such as a printed circuit board, a wafer, or the like; a heat dissipating means coupled to the interconnect device; a housing disposed about the interconnect device and the heat dissipating means; and a plurality of bus connectors disposed about the periphery of the disks and being coupled to a plurality of leads of the integrated circuit. The disks, with differing integrated circuits, may then be stacked to provide a variety of devices.

BRIEF DESCRIPTION OF THE DRAWINGS

FIG. 4 is a view in perspective of a portion of the disk of FIG. 3;

FIG. 5 is a view in perspective of a portion of a plurality of disks;

DETAILED DESCRIPTION OF THE DRAWINGS

Figure 1:
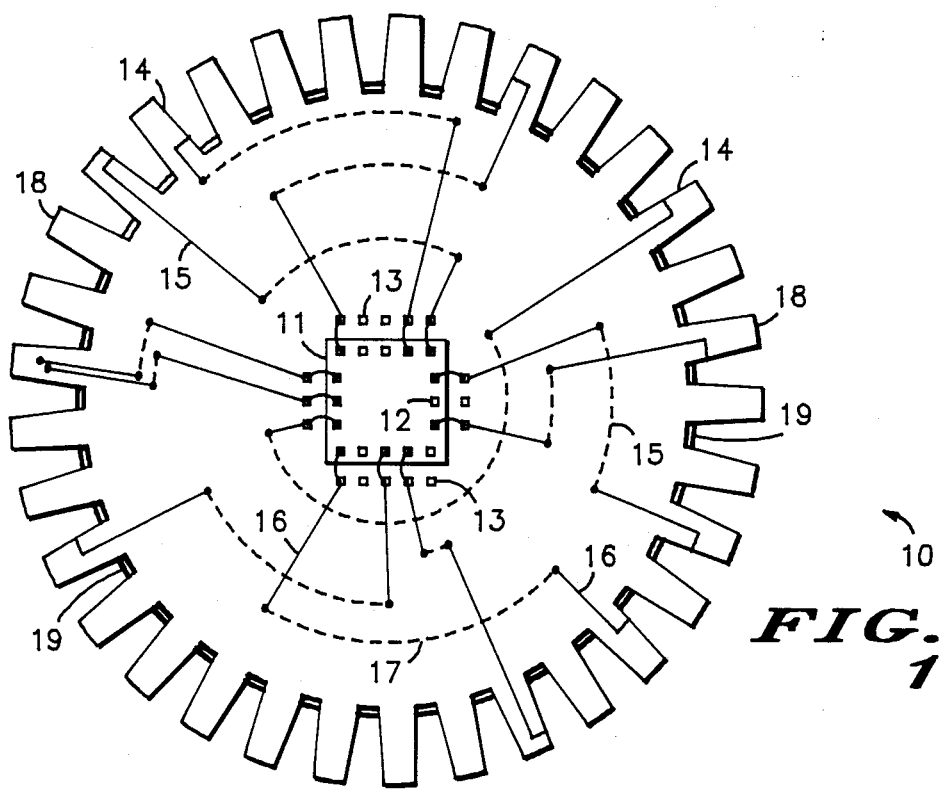
FIG. 1 is a top planar view of an interconnect device embodying the present invention.

Referring to FIG. 1, a PC board 10 embodying the present invention is illustrated. Board 10 is shown with an integrated circuit chip 11 mounted thereto. Chip 11 is shown with a plurality of chip bonding areas 12. Chip bonding areas 12 are coupled to board bonding areas 13 which are coupled to bus contacts 14 by conductors 15. Conductors 15 may be composed of two different portions, a linear portion 16 represented by the radially extending solid lines, and an arcuate portion 17 represented by the dashed lines. Solid linear lines 16 are disposed on the upper surface of board 10 and arcuate dashed lines 17 are disposed on the lower surface of board 10. These are coupled together using plated through holes or the like. This avoids the problems encountered in crossing lines.

As shown in FIG. 1, board 10 is gear shaped having a plurality of teeth 18. This provides more surface area which allows more bus contacts 14 to be placed around the circumference of board 10. If fewer contacts are desired, board 15 could be designed in a circular, or other, shape. Located between each tooth 18 is a heat sink contact 19, which will be shown in more detail below.

Figure 2:
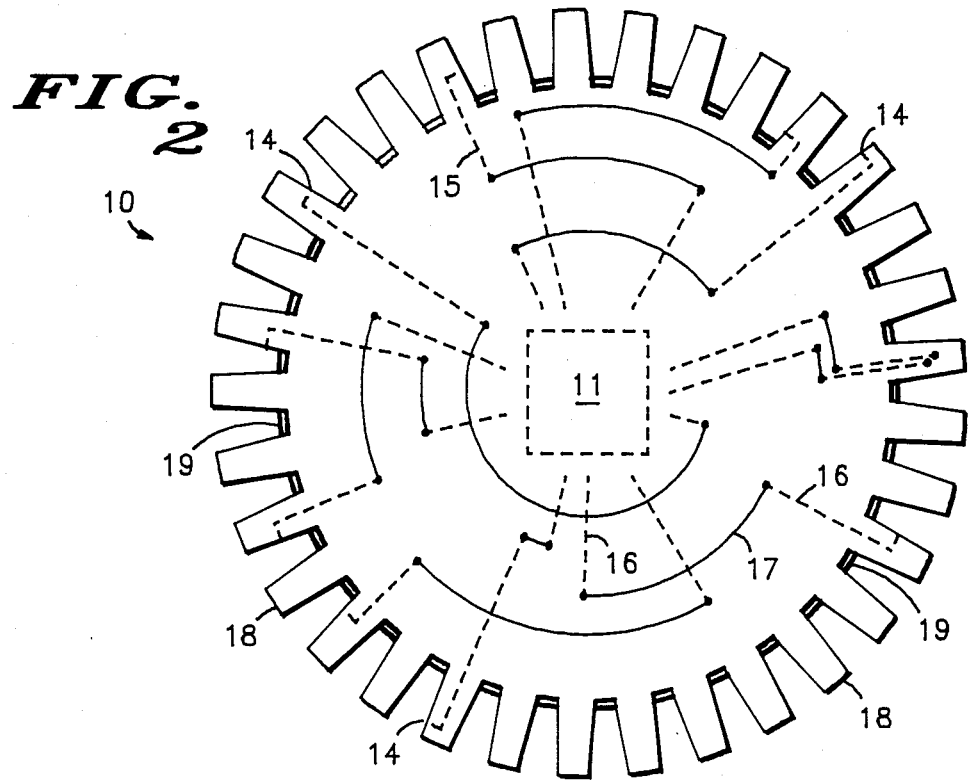
FIG. 2 is the bottom view of the interconnect device of FIG. 1.

FIG. 2 illustrates the bottom portion of interconnect device 10. This shows arcuate lines 17 as solid lines, and linear lines 16 as dashed lines. Bus contacts 14 are shown on gear teeth 18 and heat sink contacts 19 are shown disposed between teeth 18.

Figure 3:
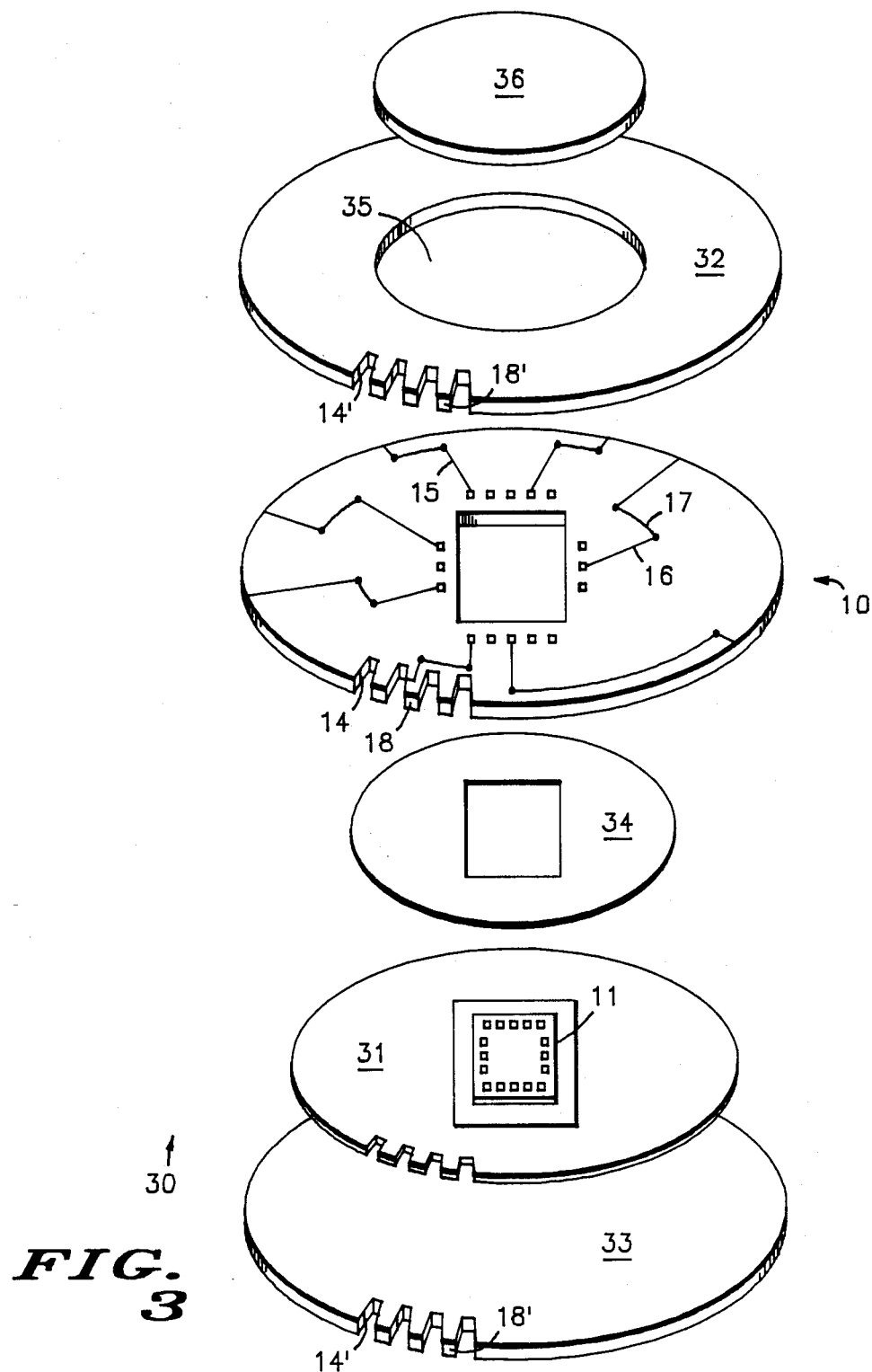
FIG. 3 is an exploded view of a disk of an integrated circuit stackable package embodying the present invention.

Referring now to FIG. 3, a disk 30 is illustrated. Disk 30 consists, generally, of: interconnect device 10, as shown in FIGS. 1 and 2; a heat spreader 31; and top and bottom caps 32 and 33, respectively. IC chip 11 is shown mounted to heat spreader 31 which consists of Berillium Copper or the like. Between heat spreader 31 and interconnect device 10 is an electrical insulator 34. Insulator 34 is used to prevent heat spreader 31 from shorting lines 17 located on the bottom of circuit board 10.

In manufacturing disk 30, top cap 32 and bottom cap 33 are coupled together with board 10, insulator 34 and heat spreader 31 sandwiched therebetween. Board 10, top cap 32 and bottom cap 33 are generally made of a ceramic material or the like. An opening 35 is provided in top cap 32 so that the bonding process, coupling IC 11 to board 10, may be completed after top cap 32 has been coupled to bottom cap 33. Once the bonding has been completed, a cover 36 is placed over opening 35.

Top cap 32 and bottom cap 33 have a periphery of the same shape as board 10 This is shown here by teeth 18'. Disposed about the periphery of teeth 18' are bus contacts 14'. These are shown in more detail in FIG. 4. FIG. 4 shows a pair of gear teeth 18 having layers equivalent to top cap 32, board 10, insulator 34, heat spreader 31, and bottom cap 33. Disposed about teeth 18 are bus contacts 14 with a leadless type contact 14'' disposed above and below disk 30. It should be noted that bus contacts 14 are insulated from heat spreader 31.

Disposed between gear teeth 18, and coupled to heat spreader 31, are the heat sink contacts 19. As will be shown below, heat sink contacts 19 are provided to make contact with an external heat bridge.

Referring now to FIG. 5, a perspective view is shown of gear teeth 18 of three disks 30. Disks 30 are stacked as shown and then may be soldered together along the bus contact areas 14. In the alternative, contact areas 14 may be of a flat contact that is press fitted. The eight bus contact areas 14 shown are lettered A-H. This would be one particular tooth of a stack of disks 30 each having 32 teeth and 256 bus contact area 14.

The eight A-H contacts 14 may be used for one eight bit bus or one contact on each of eight different teeth 18 could be used for part of the eight bit bus. By using eight different teeth 18, conductive line congestion in boards 10 can be avoided. By way of example: the A contacts could be reserved for address busses; the B contacts can be used as data busses; the C contacts can be used alternatively for ground and power contacts; and the remaining contacts D-H can be used for specific types of lines.

By assigning specific functions to each pin position, one particular disk 30 can be designed and stacked with another disk 30 without the need for custom design to assure compatibility. This provides universal building blocks for use in any specific application design required. This would provide a more economic design tool and provide flexibility in design.

Figure 6:
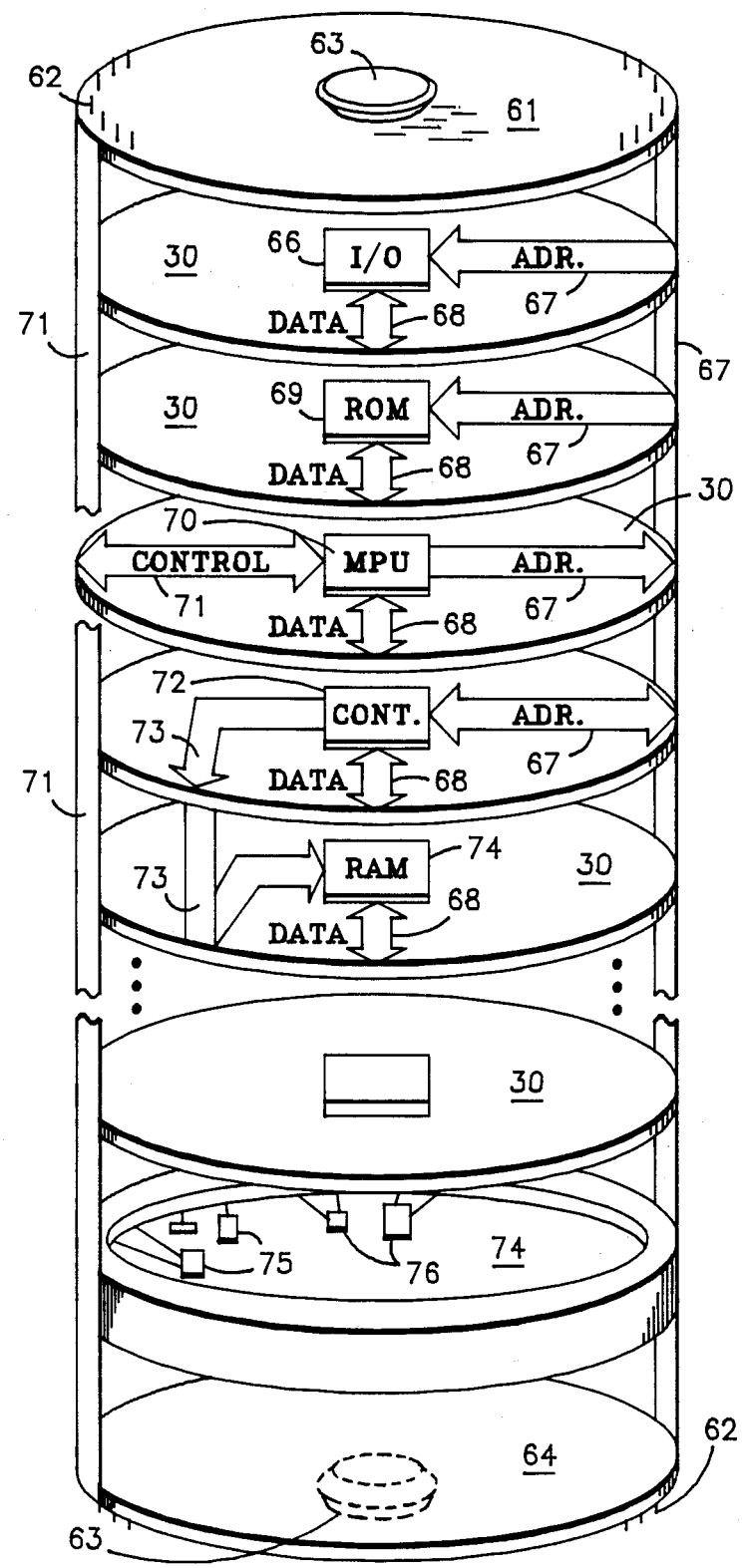
FIG. 6 is an view of portions of an integrated circuit stackable package embodying the present invention.

Referring to FIG. 6, an exploded view of portions of an integrated circuit stackable package, generally designated 60, embodying the present invention is illustrated. Package 60 illustrates the general internal design of the present invention and consists of a top cap 61 having a plurality of pins 62 orthogonal to cap 61. Located in a central portion of cap 61 is a restraining cap 63 which will be discussed in more detail below. At the opposite end of package 60 is a bottom cap 64. Bottom cap 64 is the same design as top cap 61 having a set of pins 62 orthogonal to cap 64 and a restraining cap 63.

Located between top cap 61 and bottom cap 64 is a plurality of disks 30. Disks 30 are shown here in a circular shape, rather than in the gear shape of FIGS. 1 and 2, in order to simplify the drawings. An integrated circuit chip, or chips, is mounted in each disk 30. Shown mounted in package 60 are: an I/0 device 66 being coupled to an address bus 67 and a data bus 68; a ROM 69 coupled to buses 67 and 68; an MPU 70 coupled to busses 67 and 68 and to a control bus 71; a control circuit 72 coupled to busses 67 and 68 and to a memory address bus 73; and a set of random access memory (RAM) chips 74 being coupled to buses 68 and 73. In addition to the above, a discrete PC board 74 is shown which may contain various discrete components such as resistors 75, capacitors 76 or like components.

By stacking integrated circuits 11, as shown in FIG. 6, the electrical distance from IC to IC is reduced. This will provide an increase in the operating speed of the device.

Figure 7:
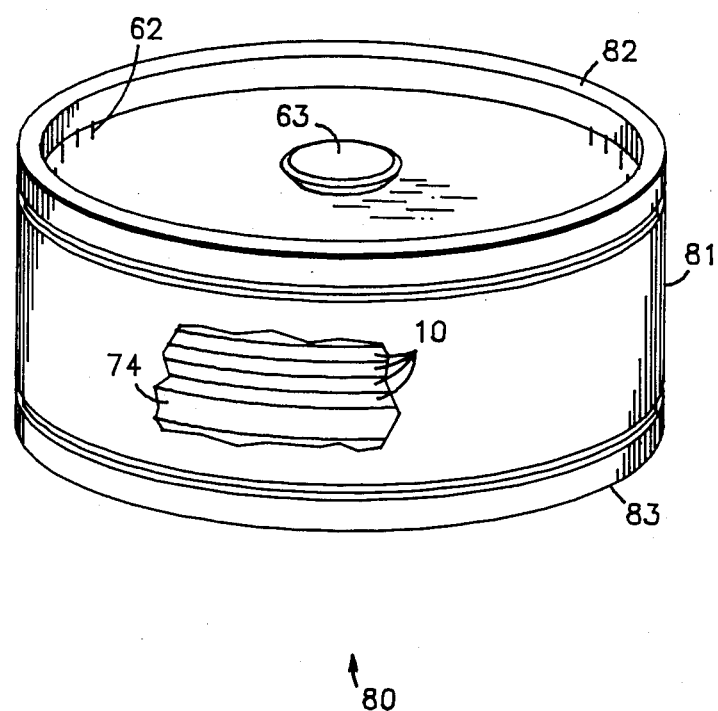
FIG. 7 is the integrated circuit stackable package of FIG. 16 shown with portions broken away.

Disks 30 and 74 are then coupled together and placed in a package 80 resulting in the final product illustrated in FIG. 7. Package 80 consists of a top cap 82, a bottom cap 83, and a housing 81. A broken out portion of housing 81 shows disks 30 and 74 as they are placed inside housing 81. Package 80 would be on the order of 2" in diameter for disks 30 having 256 contacts. The height of package 80 would vary depending on the actual number of disks 30 and 74 used. As shown in FIG. 1, the boards incorporated therein are sufficient for a stand alone computer. A package with this many boards would be approximately ¾" in height.

Figure 8:
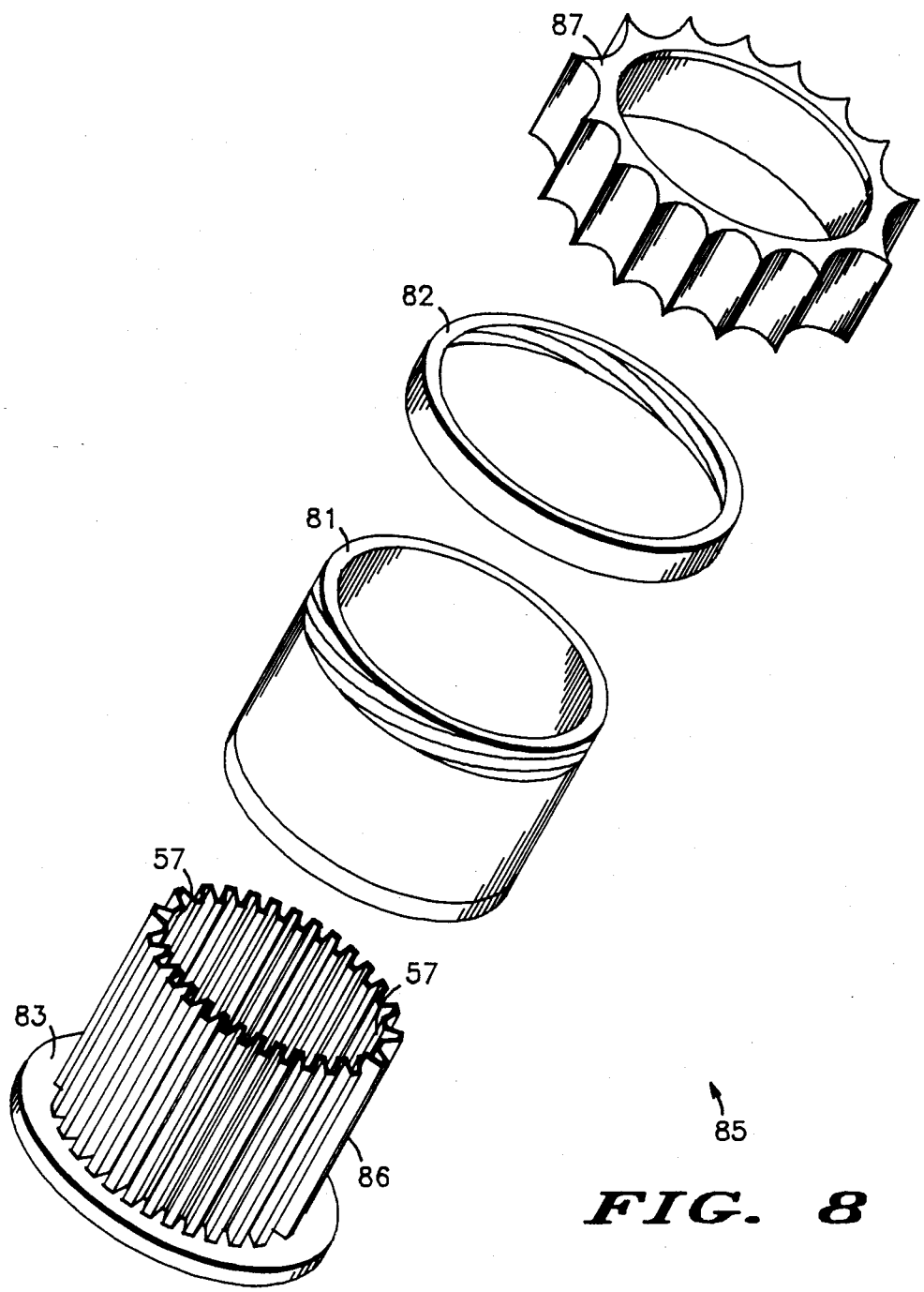
FIG. 8 is a sink dissipating design for use with the invention.

Referring now to FIG. 8, a heat removing assembly 85 is illustrated for possible use with the present invention. Assembly 85 consists of a heat bridge 86 having a design that conforms to disks 30. Bridge 86 is designed such that the inside of the inward radially extending portions 87 will contact heat sink contacts 19. The remaining inner portion of bridge 86 will be insulated from disks 30 to prevent shorting of bus contacts 14. Heat bridge 86 is contained in housing 81, FIG. 7, and held in place by top and bottom caps 82 and 83. An additional heat fin 87 can be disposed about the exterior of housing 81. By making housing 81 conductive, the heat generated in package 60 can be removed by passing through heat spreader 31, heat sink contacts 19, heat bridge 85, housing 81, and finally heat fin 87.

Figure 9:
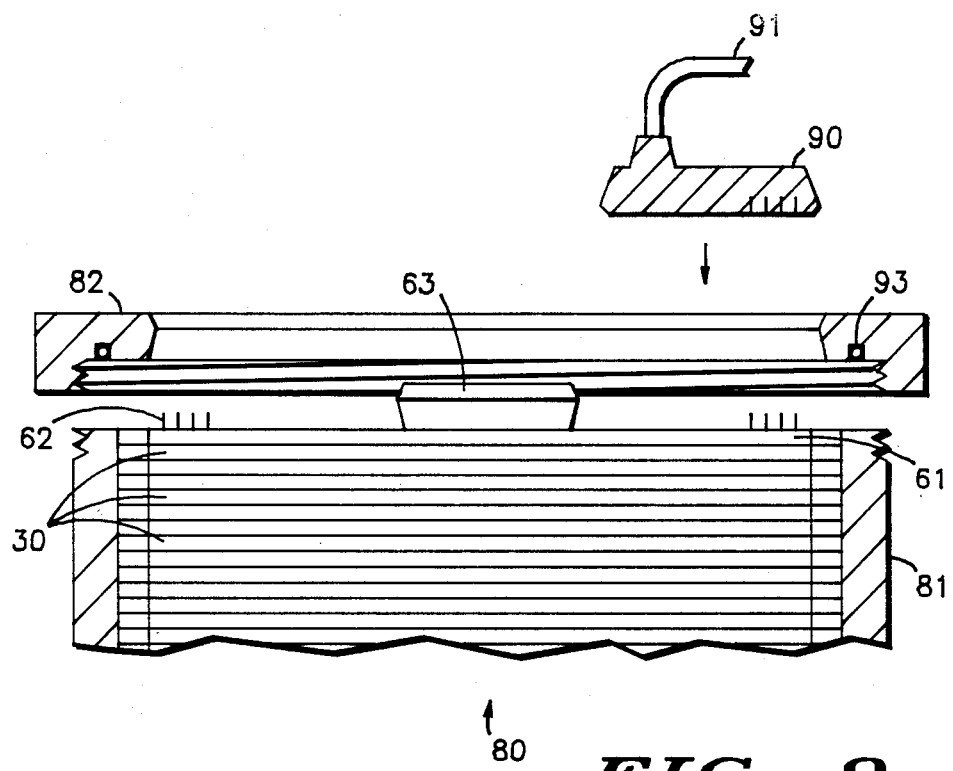
FIG. 9 is a partial cross sectional view of the integrated stackable package embodying the present invention.

In FIG. 9, a partial cross sectional view of package 80 is shown. Package 80 is shown having housing 81 containing disks 30 and cap 61. Cap 61 is designed such that all of the related bus lines, such as data or address busses, are routed to a particular locus of pins 62. A pin connector 90 is then used to couple pins 62 to an exterior cable 91. In this particular design connector 90 is a pie shaped connector that may be placed on cap 62 prior to securing top cap 82 to housing 81 or may be press fitted to cap 61 after top cap 82 is in place. As is illustrated, restraining cap 63 is sloped outward and the inner edge of top cap 82 is sloped inward. This serves to retain connector 90 in place.

As shown, top cap 82 has an 0-ring 93 disposed about the inside. This serves to provide a hermetic seal about housing 81 to prevent corrosive elements from entering package 80.

Figure 10:
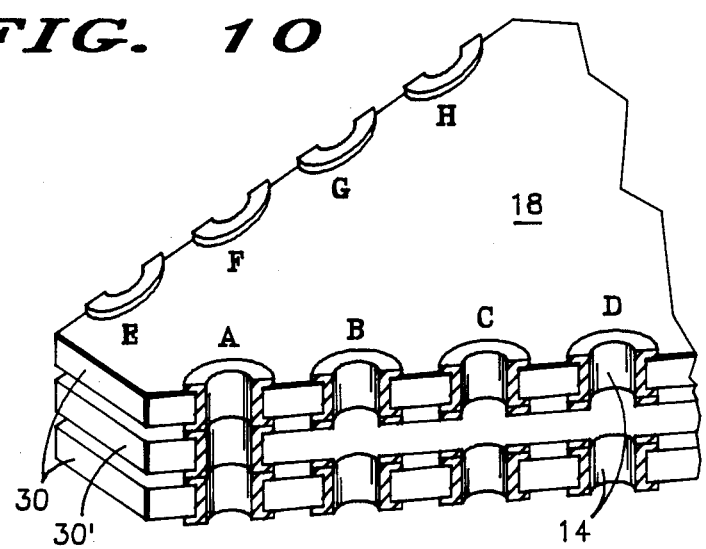
FIG. 10 is a view, in perspective, of a portion of a plurality of disks.

In FIG. 10, a perspective view of a portion of a plurality of disks 30 is illustrated. The B-D contacts of top and bottom disks 30 are separated by a central disk 30'. This allows extra bus lines to be defined within package 10. By separating all of the contacts, a total of 512 bus lines can be defined within one package 10. This would have 256 bus lines running to the top and 256 to the bottom.

In addition, this technique could be used to define separate shorter busses within package 10. These would include busses or connections that did not need access to the outside of package 10.

Thus, it is apparent to one skilled in the art that there has been provided in accordance with the invention, a device and method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. An integrated circuit stackable package comprising:
   a gear shaped interconnect device having a first surface, a second surface, and a plurality of gear shaped teeth spaced about a periphery of said interconnect device;
   a plurality of conductive contacts being disposed about said plurality of gear shaped teeth; and an integrated circuit being coupled to said gear shaped interconnect device, said integrated circuit having a plurality of leads each being coupled to one of said plurality of conductive contacts.

2. The integrated circuit stackable package of claim 1 further comprising:
   heat dissipating means for dissipating heat generated by said integrated circuit, said heat dissipating means having a first surface being coupled to said second surface of said gear shaped interconnect device and a second surface;
   a first housing portion having a first surface coupled to said second surface of said heat dissipating means and a second surface; and
   a second housing portion having a first surface and a second surface being coupled to said first surface of said gear shaped interconnect device.

3. The integrated circuit stackable package of claim 2 further comprising an electrical insulator having a first surface coupled to said second surface of said gear shaped interconnect device and a second surface coupled to said first surface of said heat dissipating means.

4. The integrated circuit stackable package of claim 2 further comprising a heat bridge being disposed about said gear shaped interconnect device and being coupled to said heat dissipating means.

5. The integrated circuit stackable package of claim 2 wherein said heat dissipating means is composed of a berillium copper compound.

6. The integrated circuit stackable package of claim 2 further comprising:
   a top cap having a periphery, a first surface, and a second surface being coupled to said first surface of said second housing portion;
   a plurality of bus connectors being disposed about said periphery of said top cap, said plurality of bus connectors being coupled to said plurality of bus connectors disposed about said periphery of said interconnect device;
   a plurality of pins being disposed on said first surface of said top cap, said plurality of pins being coupled to said plurality of bus connectors disposed about said periphery of said top cap;
   an external housing being disposed about said gear shaped interconnect device, said heat dissipating means, said first housing portion, said second housing portion and said top cap;
   a top connector having a first end for receiving said pins of said top cap and a second end being coupled to an external cable.

7. The integrated circuit stackable package of claim 2 further comprising:
   a bottom cap having a periphery, a first surface being coupled to said second surface of said first housing portion, and a second surface;
   a plurality of bus connectors being disposed about said periphery of said bottom cap, said plurality of bus connectors being coupled to said plurality of bus connectors disposed about said periphery of said interconnect device;
   a plurality of pins being disposed on said second surface of said bottom cap, said plurality of pins being coupled to said plurality of bus connectors disposed about said periphery of said bottom cap;
   an external housing being disposed about said gear shaped interconnect device, said heat dissipating means, said first housing portion, said second housing portion and said bottom cap;
   a bottom connector having a first end for receiving said pins of said bottom cap and a second end being coupled to an external cable.

8. An integrated circuit stackable package comprising a plurality of disks each having:
   an interconnect device having a first surface, a second surface and a periphery;
   an integrated circuit having a plurality of leads and being coupled to said interconnect device;
   heat dissipating means for dissipating heat generated by said integrated circuit, said heat dissipating means having a first surface being coupled to said second surface of said interconnect device, and a second surface;
   a first housing portion having a periphery, a first surface coupled to said second surface of said heat dissipating means, and a second surface;
   a second housing portion having a periphery, a first surface, and a second surface being coupled to said first surface of said interconnect device; and
   a plurality of bus connectors disposed about said peripheries of said interconnect device, said first housing portion and said second housing portion, said plurality of bus connectors being coupled to said plurality of leads of said integrated circuit.

9. The integrated circuit stackable package of claim 8 further comprising an electrical insulator having a first surface coupled to said second surface of said interconnect device and a second surface coupled to said first surface of said heat dissipating means.

10. The integrated circuit stackable package of claim 8 wherein said heat dissipating means is composed of a berillium copper compound.

11. The integrated circuit stackable package of claim 8 wherein said periphery of said interconnect device, said first housing portion and said second housing portion are gear shaped.

12. The integrated circuit stackable package of claim 8 further comprising a heat bridge being disposed about said plurality of disks and being coupled to said heat dissipating means.

13. The integrated circuit stackable package of claim 8 further comprising:
   a top cap having a periphery, a first surface, and a second surface being coupled to said first surface of said second housing portion;
   a plurality of bus connectors being disposed about said peripheries of said top cap, said plurality of bus connectors being coupled to said plurality of bus connectors disposed about said periphery of said interconnect device, said first housing portion and said second housing portion;
   a plurality of pins being disposed on said first surface of said top cap, said plurality of pins being coupled to said plurality of bus connectors disposed about said periphery of said top cap;
   an external housing being disposed about said interconnect device, said heat dissipating means, said first housing portion, said second housing portion and said top cap;
   a top connector having a first end for receiving said pins of said top cap and a second end being coupled to an external cable.

14. The integrated circuit stackable package of claim 8 further comprising:
   a bottom cap having a periphery, a first surface being coupled to said second surface of said first housing portion, and a second surface;

a plurality of bus connectors being disposed about said periphery of said bottom cap, said plurality of bus connectors being coupled to said plurality of bus connectors disposed about said peripheries of said interconnect device, said first housing portion and said second housing portion;

a plurality of pins being disposed on said second surface of said bottom cap, said plurality of pins being coupled to said plurality of bus connectors disposed about said periphery of said bottom cap;

an external housing being disposed about said interconnect device, said heat dissipating means, said first housing portion, said second housing portion and said bottom cap;

a bottom connector having a first end for receiving said pins of said bottom cap and a second end being coupled to an external cable.

15. An integrated circuit stackable package comprising:

a plurality of disks each having:
an interconnect device having a first surface, a second surface and a periphery;
an integrated circuit having a plurality of leads and being coupled to said interconnect device;
heat dissipating means for dissipating heat generated by said integrated circuit, said heat dissipating means having a first surface being coupled to said second surface of said interconnect device, and a second surface;
a first housing portion having a periphery, a first surface coupled to said second surface of said heat dissipating means, and a second surface;
a second housing portion having a periphery, a first surface, and a second surface being coupled to said first surface of said interconnect device; and
a plurality of bus connectors disposed about said peripheries of said interconnect device, said first housing portion and said second housing portion, said plurality of bus connectors being coupled to said plurality of leads of said integrated circuit;

a heat bridge being disposed about said plurality of disks and being coupled to said heat dissipating means;

a top cap having a periphery, a first surface, and a second surface being coupled to said first surface of said second housing portion;

a plurality of bus connectors being disposed about said peripheries of said top cap, said plurality of bus connectors being coupled to said plurality of bus connectors disposed about said periphery of said interconnect device, said first housing portion and said second housing portion;

a plurality of pins being disposed on said first surface of said top cap, said plurality of pins being coupled to said plurality of bus connectors disposed about said periphery of said to cap;

an external housing being disposed about said interconnect device, said heat dissipating means, said first housing portion, said second housing portion and said top cap;

a top connector having a first end for receiving said pins of said top cap and a second end being coupled to an external cable.

16. The integrated circuit stackable package of claim 15 further comprising an electrical insulator having a first surface coupled to said second surface of said interconnect device and a second surface coupled to said first surface of said heat dissipating means.

17. The integrated circuit stackable package of claim 15 wherein said periphery of said interconnect device, said first housing portion and said second housing portion are gear shaped.

18. The integrated circuit stackable package of claim 15 further comprising:

a bottom cap having a periphery, a first surface being coupled to said second surface of said first housing portion, and a second surface;

a plurality of bus connectors being disposed about said periphery of said bottom cap, said plurality of bus connectors being coupled to said plurality of bus connectors disposed about said peripheries of said interconnect device, said first housing portion and said second housing portion;

a plurality of pins being disposed on said second surface of said bottom cap, said plurality of pins being coupled to said plurality of bus connectors disposed about said periphery of said bottom cap;

an external housing being disposed about said interconnect device, said heat dissipating means, said first housing portion, said second housing portion and said bottom cap;

a bottom connector having a first end for receiving said pins of said bottom cap and a second end being coupled to a external cable.

* * * * *